(12) United States Patent
Liang et al.

(10) Patent No.: US 10,707,116 B2
(45) Date of Patent: Jul. 7, 2020

(54) CYCLIC FLOWABLE DEPOSITION AND HIGH-DENSITY PLASMA TREATMENT PROCESSES FOR HIGH QUALITY GAP FILL SOLUTIONS

(71) Applicant: Applied Materials, Inc., Santa Clara, CA (US)

(72) Inventors: Jingmei Liang, San Jose, CA (US); Yong Sun, San Jose, CA (US); Jinrui Guo, Santa Clara, CA (US); Praket P. Jha, San Jose, CA (US); Jung Chan Lee, San Jose, CA (US); Tza-Jing Gung, San Jose, CA (US); Mukund Srinivasan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 153 days.

(21) Appl. No.: 15/977,380

(22) Filed: May 11, 2018

(65) Prior Publication Data
US 2018/0330980 A1    Nov. 15, 2018

Related U.S. Application Data

(60) Provisional application No. 62/505,857, filed on May 13, 2017.

(51) Int. Cl.
*H01L 21/762* (2006.01)
*H01L 21/02* (2006.01)
(Continued)

(52) U.S. Cl.
CPC ...... *H01L 21/76224* (2013.01); *C23C 16/045* (2013.01); *C23C 16/308* (2013.01);
(Continued)

(58) Field of Classification Search
None
See application file for complete search history.

(56) References Cited

U.S. PATENT DOCUMENTS

| | | | |
|---|---|---|---|
| 8,304,351 B2 | 11/2012 | Wang et al. | |
| 8,318,584 B2 | 11/2012 | Li et al. | |
| | (Continued) | | |

OTHER PUBLICATIONS

International Search Report and Written Opinion dated Sep. 18, 2018 for Application No. PCT/US2018/030699.
(Continued)

*Primary Examiner* — Mounir S Amer
(74) *Attorney, Agent, or Firm* — Patterson +Sheridan, LLP (57) ABSTRACT

Implementations disclosed herein relate to methods for forming and filling trenches in a substrate with a flowable dielectric material. In one implementation, the method includes subjecting a substrate having at least one trench to a deposition process to form a flowable layer over a bottom surface and sidewall surfaces of the trench in a bottom-up fashion until the flowable layer reaches a predetermined deposition thickness, subjecting the flowable layer to a first curing process, the first curing process being a UV curing process, subjecting the UV cured flowable layer to a second curing process, the second curing process being a plasma or plasma-assisted process, and performing sequentially and repeatedly the deposition process, the first curing process, and the second curing process until the plasma cured flowable layer fills the trench and reaches a predetermined height over a top surface of the trench.

20 Claims, 10 Drawing Sheets

(51) Int. Cl.
  *H01L 21/67* (2006.01)
  *C23C 16/32* (2006.01)
  *C23C 16/36* (2006.01)
  *C23C 16/40* (2006.01)
  *H01J 37/32* (2006.01)
  *C23C 16/455* (2006.01)
  *C23C 16/30* (2006.01)
  *C23C 16/34* (2006.01)
  *C23C 16/505* (2006.01)
  *C23C 16/04* (2006.01)

(52) U.S. Cl.
  CPC .......... *C23C 16/325* (2013.01); *C23C 16/345* (2013.01); *C23C 16/36* (2013.01); *C23C 16/402* (2013.01); *C23C 16/4554* (2013.01); *C23C 16/45523* (2013.01); *C23C 16/505* (2013.01); *H01J 37/32899* (2013.01); *H01L 21/0214* (2013.01); *H01L 21/0217* (2013.01); *H01L 21/0228* (2013.01); *H01L 21/0234* (2013.01); *H01L 21/02126* (2013.01); *H01L 21/02164* (2013.01); *H01L 21/02167* (2013.01); *H01L 21/02211* (2013.01); *H01L 21/02216* (2013.01); *H01L 21/02219* (2013.01); *H01L 21/02274* (2013.01); *H01L 21/02326* (2013.01); *H01L 21/02329* (2013.01); *H01L 21/02337* (2013.01); *H01L 21/02348* (2013.01); *H01L 21/67167* (2013.01); *H01L 21/67184* (2013.01); *H01L 21/67207* (2013.01); *H01L 21/76229* (2013.01); *H01J 37/32357* (2013.01); *H01J 2237/3321* (2013.01)

(56) References Cited

U.S. PATENT DOCUMENTS

| | | |
|---|---|---|
| 2007/0298585 A1 | 12/2007 | Lubomirsky et al. |
| 2012/0149213 A1 | 6/2012 | Nittala et al. |
| 2014/0017904 A1* | 1/2014 | Gauri ............ C23C 16/045 438/778 |
| 2014/0134812 A1 | 5/2014 | Kim et al. |
| 2014/0302690 A1 | 10/2014 | Underwood et al. |
| 2015/0179501 A1 | 6/2015 | Jhaveri et al. |
| 2016/0126089 A1* | 5/2016 | Liang ............ H01L 21/0214 438/786 |
| 2016/0194758 A1 | 7/2016 | Nemani et al. |
| 2016/0244879 A1 | 8/2016 | Liang et al. |

OTHER PUBLICATIONS

Taiwan Office Action dated Mar. 3, 2020 for Application No. 107116115.

* cited by examiner

CYCLIC FLOWABLE DEPOSITION AND HIGH-DENSITY PLASMA TREATMENT PROCESSES FOR HIGH QUALITY GAP FILL SOLUTIONS

CROSS-REFERENCE TO RELATED APPLICATIONS

This application claims priority to U.S. provisional patent application Ser. No. 62/505,857, filed May 13, 2017, which is herein incorporated by reference.

BACKGROUND

Field

Implementations of the present disclosure generally relate to methods for forming and filling trenches in a substrate with a flowable dielectric material.

Description of the Related Art

Widths of trenches on modern devices have been narrowed to a point where the aspect ratio of trench depth to width becomes high enough to result in challenges with filling the trench with dielectric material. The depositing dielectric material is prone to clog at the top before the trench completely fills, producing a void or seam in the middle of the trench. This problem becomes worse especially when the trenches are formed with a different diameter at the top and bottom of the trenches due to pattern loading effects.

Thus, there is a need in the art for new deposition processes to address the above-mentioned issues.

SUMMARY

Implementations disclosed herein relate to methods for forming and filling trenches in a substrate with a flowable dielectric material. In one implementation, the method includes subjecting a substrate having at least one trench to a deposition process to form a flowable layer over a bottom surface and sidewall surfaces of the trench in a bottom-up fashion until the flowable layer reaches a predetermined deposition thickness, subjecting the flowable layer to a first curing process, the first curing process being a UV curing process, subjecting the UV cured flowable layer to a second curing process, the second curing process being a plasma or plasma-assisted process, and performing sequentially and repeatedly the deposition process, the first curing process, and the second curing process until the plasma cured flowable layer fills the trench and reaches a predetermined height over a top surface of the trench.

In another implementation, the method includes performing a deposition process by reacting a silicon-containing precursor with an oxygen-based radical precursor and a nitrogen-based radical precursor to form a flowable layer within a trench of a substrate, curing the flowable layer in a plasma chamber, wherein the second process chamber has an oxygen-containing ambient or a nitrogen-containing ambient, and performing sequentially and repeatedly the deposition process and the curing process until the cured flowable layer fills the trench and reaches a predetermined height over a top surface of the trench.

In yet another implementation, a cluster tool for processing a substrate is provided. The cluster tool includes a load lock chamber, a transfer chamber coupled to a first side of the load lock chamber, a plurality of first processing chambers coupled to the transfer chamber, wherein each of the first processing chambers is a deposition chamber capable of performing a flowable layer deposition, a plurality of second processing chambers coupled to the transfer chamber, wherein each of the second processing chambers is a curing chamber capable of performing a curing process, a plurality of third processing chambers coupled to the transfer chamber, wherein each of the third processing chambers is a plasma chamber capable of performing a plasma curing process, and a factory interface coupled to a second side of the load chamber.

In one another implementation, the cluster tool includes a load lock chamber, a first vacuum transfer chamber coupled to a first side of the load lock chamber, a second vacuum transfer chamber, a cooling station disposed between the first vacuum transfer chamber and the second vacuum transfer chamber, a factory interface coupled to a second side of the load lock chamber, a plurality of first processing chambers coupled to the first vacuum transfer chamber, wherein each of the first processing chambers is a deposition chamber capable of performing a flowable layer deposition, and a plurality of second processing chambers coupled to the second vacuum transfer chamber, wherein each of the second processing chambers is a plasma chamber capable of performing a plasma curing process.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of scope, for the disclosure may admit to other equally effective implementations.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Figure 1:
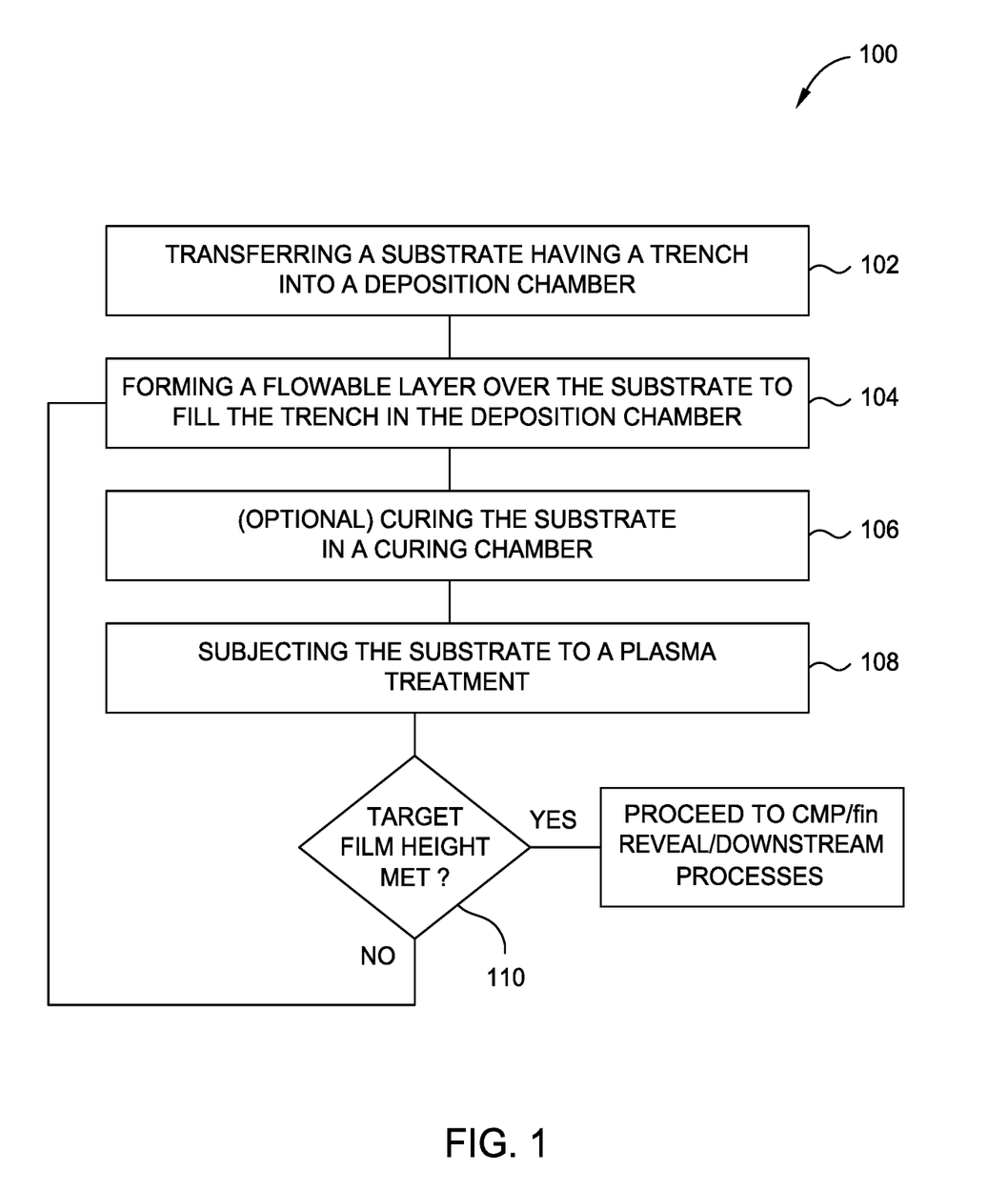
FIG. 1 is a flowchart showing selected operations in an example method of forming a flowable dielectric layer which facilitates filling of trenches.
Figure 2A:
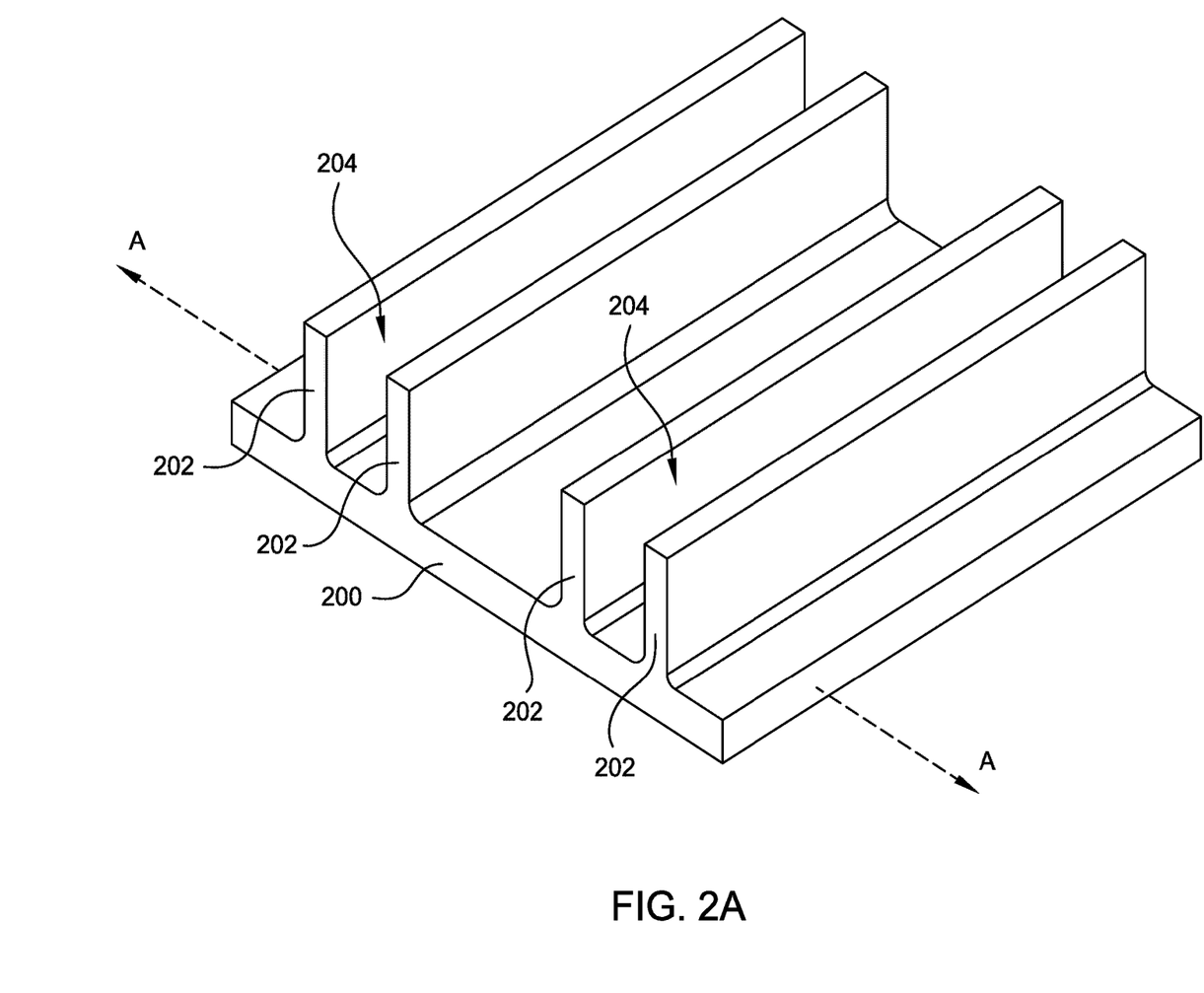
FIG. 2A illustrates a schematic three-dimensional view of a portion of a substrate.

FIG. 1 is a flowchart showing selected operations in method 100 of forming a flowable dielectric layer which facilitates filling of trenches. FIG. 2A illustrates a schematic three-dimensional view of a portion of a substrate 200.

FIGS. 2B-2G are schematic cross-sectional views of a portion of a semiconductor device structure along line A-A of FIG. 2A. FIGS. 2B-2G illustrate the substrate 200 of FIG. 2A during various stages of fabrication according to the flowchart of FIG. 1. To facilitate explanation, FIG. 1 and FIGS. 2A-2G will be explained in conjunction.

The method 100 starts at block 102 by transferring a substrate, such as the substrate 200 shown in FIG. 2A, into a substrate processing region of a deposition chamber. Suitable deposition chamber may include a high-density plasma CVD chamber, a plasma enhanced CVD chamber, a sub-atmospheric CVD chamber, or the like. Exemplary deposition chamber that may be adapted to form the flowable oxide/nitride layer include Producer® ETERNA CVD® system or Ultima HDP CVD® system, both are available from Applied Materials, Inc., of Santa Clara, Calif. It is contemplated that other suitable deposition chambers, including those from other manufacturers, may also be utilized.

The substrate 200 has fins 202 formed thereon. Each fin 202 can function as an active area where one or more devices are to be formed. The fins 202 are fabricated using suitable processes performed on the substrate 200, including masking, photolithography, and/or etch processes, to form trenches 204 into the substrate 200, leaving the fins 202 extended upwardly from the substrate 200.

The aspect ratio of the trenches 204 can be about 1:1, about 2:1, about 3:1, about 5:1, about 10:1, about 15:1, about 20:1, about 30:1, about 50:1, about 100:1 or above. In some implementations, the aspect ratio of the trenches 204 may be about 10:1 to about 30:1, for example about 15:1. The term "aspect ratio" described herein refers to the ratio of height dimension to width dimension of a particular feature, for example, the trench 204 formed in the substrate 200.

The substrate 200 may be any substrate capable of having material deposited thereon, such as a silicon substrate, for example silicon (doped or undoped), crystalline silicon (e.g., Si<100> or Si<111>), silicon oxide, doped or undoped polysilicon, or the like, a germanium substrate, a silicon germanium (SiGe) substrate, a III-V compound substrate, such as a gallium arsenide substrate, a silicon carbide (SiC) substrate, a patterned or non-patterned semiconductor-on-insulator (SOD substrate, a carbon doped oxide, a silicon nitride, a display substrate such as a liquid crystal display (LCD), a plasma display, an electro luminescence (EL) lamp display, a solar array, solar panel, a light emitting diode (LED) substrate, glass, sapphire, or any other materials such as metals, metal alloys, and other conductive materials. One or more electrical devices such as various N-type metal-oxide semiconductor (NMOS) and/or P-type metal-oxide semiconductor (PMOS) devices, such as transistors, capacitors, resistors, diodes, photo-diodes, fuses, and the like, could be formed in the substrate 200. It is contemplated that the substrate 200 is not limited to any particular size or shape. Therefore, the substrate 200 may be a circular substrate having a 200 mm diameter, a 300 mm diameter or other diameters, such as 450 mm, among others. The substrate 200 may also be any polygonal, square, rectangular, curved or otherwise non-circular workpiece.

Figure 2B:
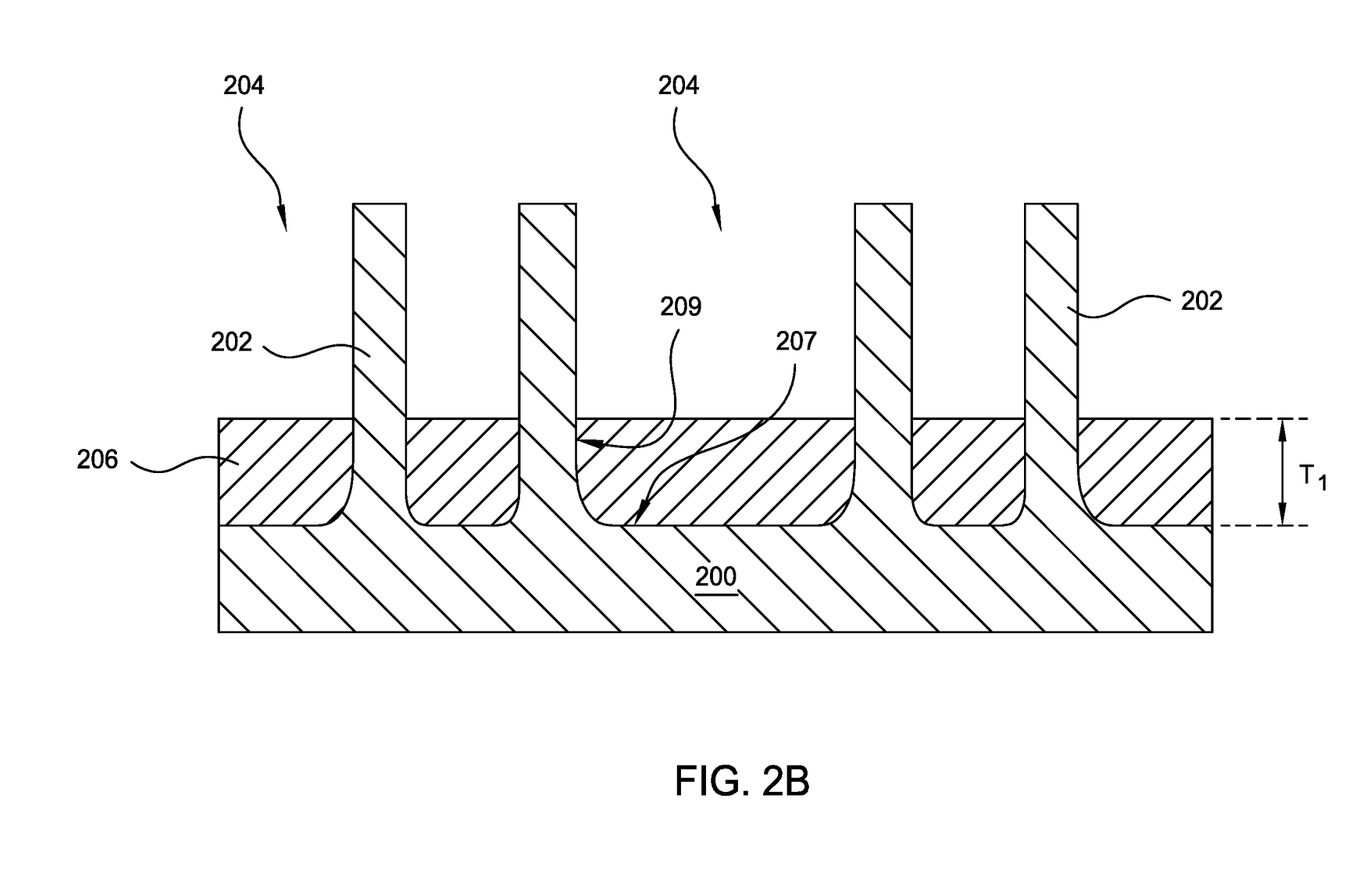
FIGS. 2B-2G illustrate the substrate of FIG. 2A during various stages of fabrication according to the flowchart of FIG. 1.

At block 104, a flowable layer 206 is formed over the substrate 200. The flowable layer 206 may be a dielectric layer containing at least silicon. In some embodiments, the flowable layer 206 is a dielectric layer containing at least silicon and oxygen. In some embodiments, the flowable layer 206 is a dielectric layer containing at least silicon and nitrogen. In some embodiments, the flowable layer 206 is a dielectric layer containing at least silicon, oxygen and nitrogen. In cases where the flowable layer 206 is a dielectric layer containing silicon, oxygen and nitrogen, a silicon-containing precursor, an oxygen-based radical precursor, and a nitrogen-based radical precursor may be introduced into the deposition chamber to form the flowable layer 206 over the substrate 200. The flowable layer 206 may be deposited on exposed surfaces of the substrate 200 and fill the trenches 204. In one embodiment, the flowable layer 206 is formed over a bottom surface 207 and along sidewall surfaces 209 of the trenches 204, as shown in FIG. 2B. Suitable flowable layers 206 may include, but is not limited to SiC, SiO, SiCN, $SiO_2$, SiOC, SiOCN, SiON, or SiN. Alternatively, the flowable layer 206 may not contain traceable amounts of carbon (i.e., carbon free).

The flowable layer 206 provides flowability to allow a bottom-up filling of the trenches 204 in a seam-free or void-free fashion. The flowability may be due, at least in part, to the presence of short chained polysilazane polymers in the deposited layer. For example, the deposited layer may have a silazane-type, Si—NH—Si backbone (i.e., a Si—N—H layer). The nitrogen which allows the formation of short chained polymers and flowability may originate from either the radical precursors or the silicon-containing precursor. Because the dielectric layer is flowable, the dielectric layer can fill trenches with high aspect ratios in a bottom-up fashion without creating voids in the trenches 204. The deposition of the flowable layer 206 may be stopped when a predetermined deposition thickness is reached. In one embodiment, the predetermined deposition thickness "T1" is in a range of about 20 Angstroms to about 300 Angstroms. The flowability of the dielectric layer attenuates as the deposition proceeds and the flowability is essentially removed during a subsequent curing/plasma treatment stages.

Suitable silicon-containing precursor may include organosilicon compounds having a ratio of oxygen to silicon atoms of 0 to about 6. Suitable organosilicon compounds may be siloxane compounds, halogenated siloxane compounds that include one or more halogen moieties (e.g., fluoride, chloride, bromide, or iodide), such as tetrachlorosilane, dichlorodiethoxysiloxane, chlorotriethoxysiloxane, hexachlorodisiloxane, and/or octachlorotrisiloxane, and aminosilanes, such as trisilylamine (TSA), hexamethyldisilazane (HMDS), silatrane, tetrakis(dimethylamino)silane, bis(diethylamino)silane, tris(dimethyl-amino)chlorosilane, and methylsilatrane. Other silicon-containing precursors, such as silanes, halogenated silanes, organosilanes, and any combinations thereof, may also be used. Silanes may include silane ($SiH_4$) and higher silanes with the empirical formula $Si_xH_{(2x+2)}$, such as disilane ($Si_2H_6$), trisilane ($Si_3H_6$), and tetrasilane ($Si_4H_{10}$), or other higher order silanes such as polychlorosilane.

The oxygen-based radical precursor may include oxygen radicals that are formed from oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors, and any combination thereof. The oxygen radicals may be generated remotely and introduced with the silicon-containing precursor. The oxygen-based radical precursor may be activated prior to introduction to the deposition chamber, for example using a remote plasma source, which may have a CCP (capacitively-coupled plasma) or ICP (inductively-coupled plasma) configuration.

The nitrogen-based radical precursor may include nitrogen radicals that are formed from nitrogen ($N_2$), nitrous oxide ($N_2O$), nitric oxide (NO), nitrogen dioxide ($NO_2$), ammonia ($NH_3$), and any combination thereof. The nitrogen radicals may be generated remotely and introduced with the silicon-containing precursor and the oxygen-based radical precursor. The nitrogen-based radical precursor may be activated prior to introduction to the deposition chamber, for example using a remote plasma source, which may have a CCP (capacitively-coupled plasma) or ICP (inductively-coupled plasma) configuration.

In some implementations, the oxygen-based radical precursor is flowed into the deposition chamber at a first volumetric flowrate, and the silicon-containing precursor is flowed into the deposition chamber at a second volumetric flowrate, and a ratio of the first volumetric flowrate to the second volumetric flowrate may be controlled at between about 0.3:1 and about 0.9:1, such as about 0.5:1 to about 0.7:1, for example about 0.6:1.

In some implementations, the nitrogen-based radical precursor is flowed into the deposition chamber at a first volumetric flowrate, and the silicon-containing precursor is flowed into the deposition chamber at a second volumetric flowrate, and a ratio of the first volumetric flowrate to the second volumetric flowrate can be controlled at between about 0.2:1 and about 0.8:1, such as about 0.4:1 to about 0.6:1, for example about 0.5:1.

It is contemplated that the oxygen-based radical precursor or the nitrogen-based radical precursor may be omitted if a radical precursor containing both oxygen and nitrogen radicals is used.

The silicon-containing precursor, the oxygen-based radical precursor, and the nitrogen-based radical precursor may be reacted at a temperature of about 150 degrees Celsius or less, for example about 100 degrees Celsius or less, for example about 65 degrees Celsius. During formation of the flowable dielectric layer, the chamber pressure of the deposition chamber may be maintained at about 0.1 Torr to about 10 Torr, for example about 0.5 Torr to about 6 Torr. The deposition rate may be controlled at about 50 Angstroms/second or below to provide sufficient thin deposition control. In one implementation, the deposition rate is controlled at about 5 Angstroms/second or less, for example about 4 Angstroms/second. Slower deposition rate (5 Å/second or below) may be advantageous in some applications as the slower deposition rate allows the flowable layer to form void free and with a smooth surface roughness.

Figure 2C:
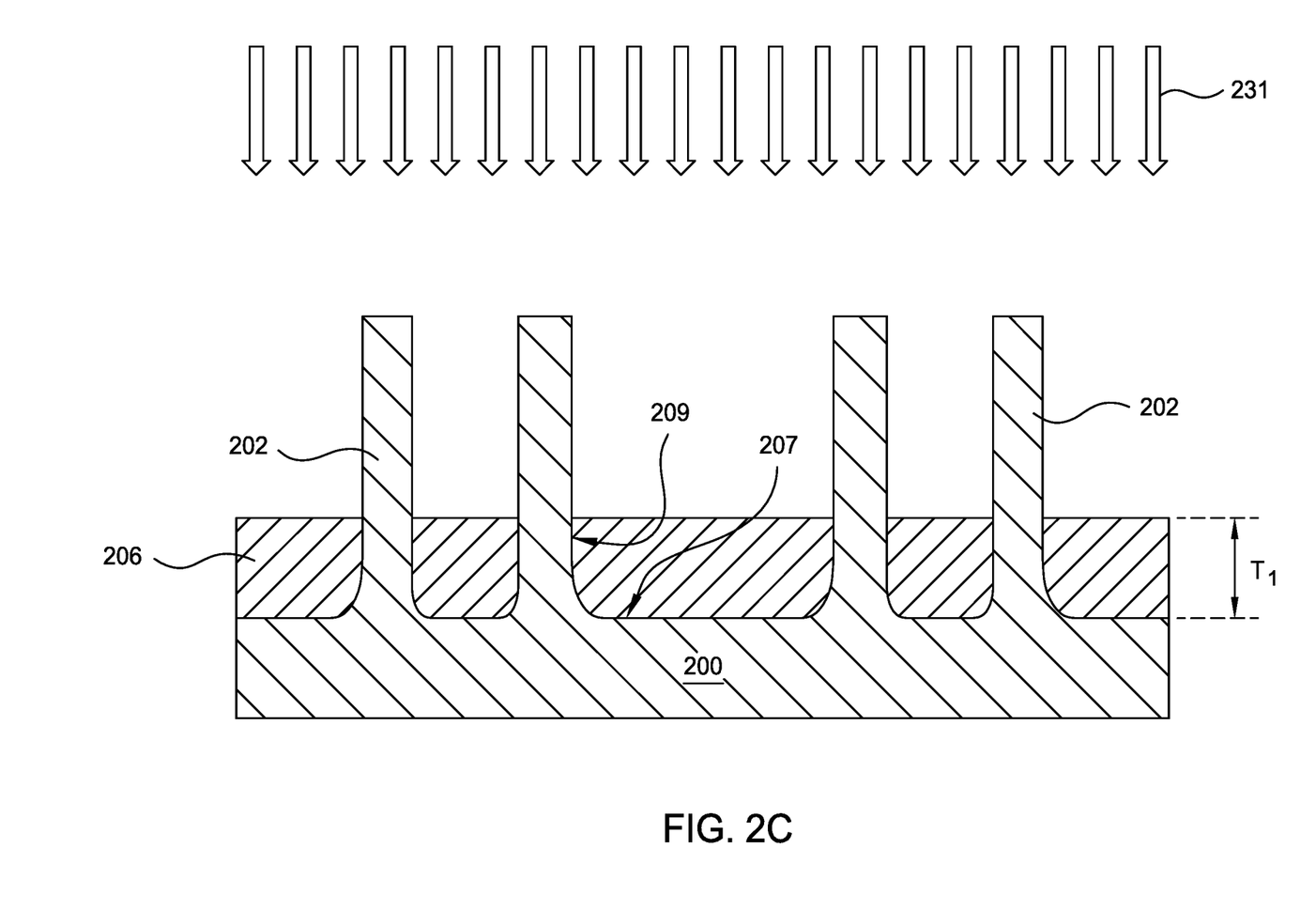

At block 106, once the flowable layer reaches a predetermined deposition thickness "T1" (e.g., about 20-300 Å), the flows of the silicon-containing precursor, the oxygen-based radical precursor, and the nitrogen-based radical precursor are discontinued and the substrate is subjected to a first curing process 231 in a curing chamber, as shown in FIG. 2C. The flowable layer 206 after curing exhibits higher density, better stability and can withstand high temperature to be performed in the subsequent plasma treatment (block 108). The curing chamber may use any suitable curing technique such as UV light curing, thermal curing, microwave curing, plasma curing, e-beam curing, or neutral beam curing. In some implementations, the curing process is optional and may be omitted. In one implementation, the curing chamber is a UV curing chamber. Exemplary curing chamber may include Producer® NANOCURE™ 3 UV cure chamber, both is available from Applied Materials, Inc., of Santa Clara, Calif. It is contemplated that other suitable curing chambers from other manufacturers may also be utilized to perform the processes discussed herein.

The curing process 231 may be performed in an oxygen-containing ambient, a nitrogen-containing ambient, and/or in an inert gas ambient. The oxygen-containing ambient may be created by introducing one or more oxygen-containing gases such as molecular oxygen ($O_2$), ozone ($O_3$), water vapor ($H_2O$), nitric oxide (NO), nitrogen dioxide ($NO_2$), nitrous oxide ($N_2O$), and any combination thereof, into the curing chamber. The nitrogen-containing ambient may be created by introducing one or more nitrogen-containing gases such as nitrogen ($N_2$), ammonia ($NH_3$), and any combination thereof, into the curing chamber. The inert ambient may be created by introducing helium, argon, hydrogen, krypton, xenon, and any combination thereof, into the curing chamber. If desired, the curing process may be performed in a radical-based ambient, i.e., using radicals from the oxygen-containing gases, the nitrogen-containing gases, or the inert gas, to help incorporate oxygen/nitrogen atoms into the flowable layer 206.

In some embodiments where the flowable layer is an oxide, the curing process 231 may be performed in an oxygen-containing ambient. In such a case, the curing process may use thermal or UV in ozone ambient for oxygen insertion and film crosslinking purposes. The oxygen-containing ambient provides oxygen to covert the flowable layer, which may be a silicon-containing layer, into a silicon oxide layer. In cases where the flowable layer is a nitride, the curing process may be performed in a nitrogen-containing ambient. In such a case, the curing process may use UV in nitrogen or ammonia ambient to nitridize the flowable layer and increase nitrogen concentration in the deposited layer. In either case, the curing process can help stabilize volatile bondings of the deposited layer and thus forms a thermally stable layer before the plasma treatment (block 108). Longer UV treatment typically results in lower shrinkage and close to neutral film stress after the plasma treatment.

In one implementation, the curing process 231 uses a UV light curing technique. The curing process can enable film crosslinking thermally or assisted by UV photons in the desired ambient (reactive or inert), temperature and pressure. Exemplary UV light curing techniques may include supplying light or photon energy from one or more UV light sources that project light onto the substrate. These UV light sources may include a UV lamp that emits light over a broad spectrum of wavelengths (including non-UV wavelengths) that has a peak intensity at a UV wavelength (e.g., 220 nm). Examples of UV lamps include xenon lamps (peak emission wavelength at 172 nm), mercury lamps (peak at 243 nm), deuterium lamps (peak at 140 nm), and krypton chloride ($KrCl_2$) lamps (peak at 222 nm), among other types of UV lamps. Additional UV light sources may include lasers that provide coherent, narrowband UV light to the flowable layer. Laser light sources may include Excimer lasers (e.g., a XeCl, KrF, $F_2$, etc., excimer laser) and/or appropriate harmonics of solid state lasers (e.g., Nd-YAG lasers). UV light sources may also include diode UV light sources.

During the curing process 231, the flowable layer 206 is cured for about 10 seconds to about 60 minutes, which may vary depending upon the application. The pressure of the curing chamber may be in a range from about 1 Torr to about 600 Torr, for example about 10 Torr to 150 Torr. The curing temperature may be in a range from about 5 degrees Celsius to about 1100 degrees Celsius, for example about 10 degrees Celsius, about 25 degrees Celsius, about 50 degrees Celsius, about 100 degrees Celsius, about 200 degrees Celsius, about 300 degrees Celsius, about 400 degrees Celsius, about 500 degrees Celsius, about 600 degrees Celsius, about 700 degrees Celsius, about 800 degrees Celsius, about 900 degrees Celsius, about 1000 degrees Celsius. In one example, the curing process is a thermal curing process performed in ozone ambient at a temperature of about 350 degrees Celsius and about 500 Torr for about 100 seconds.

In some cases where thermal curing is adapted, the curing process may be performed in-situ in the deposition chamber where the flowable layer 206 is deposited, or may be performed in a plasma chamber (block 108) where the plasma treatment is to be performed, depending on curing temperature and pressure.

Figure 2D:
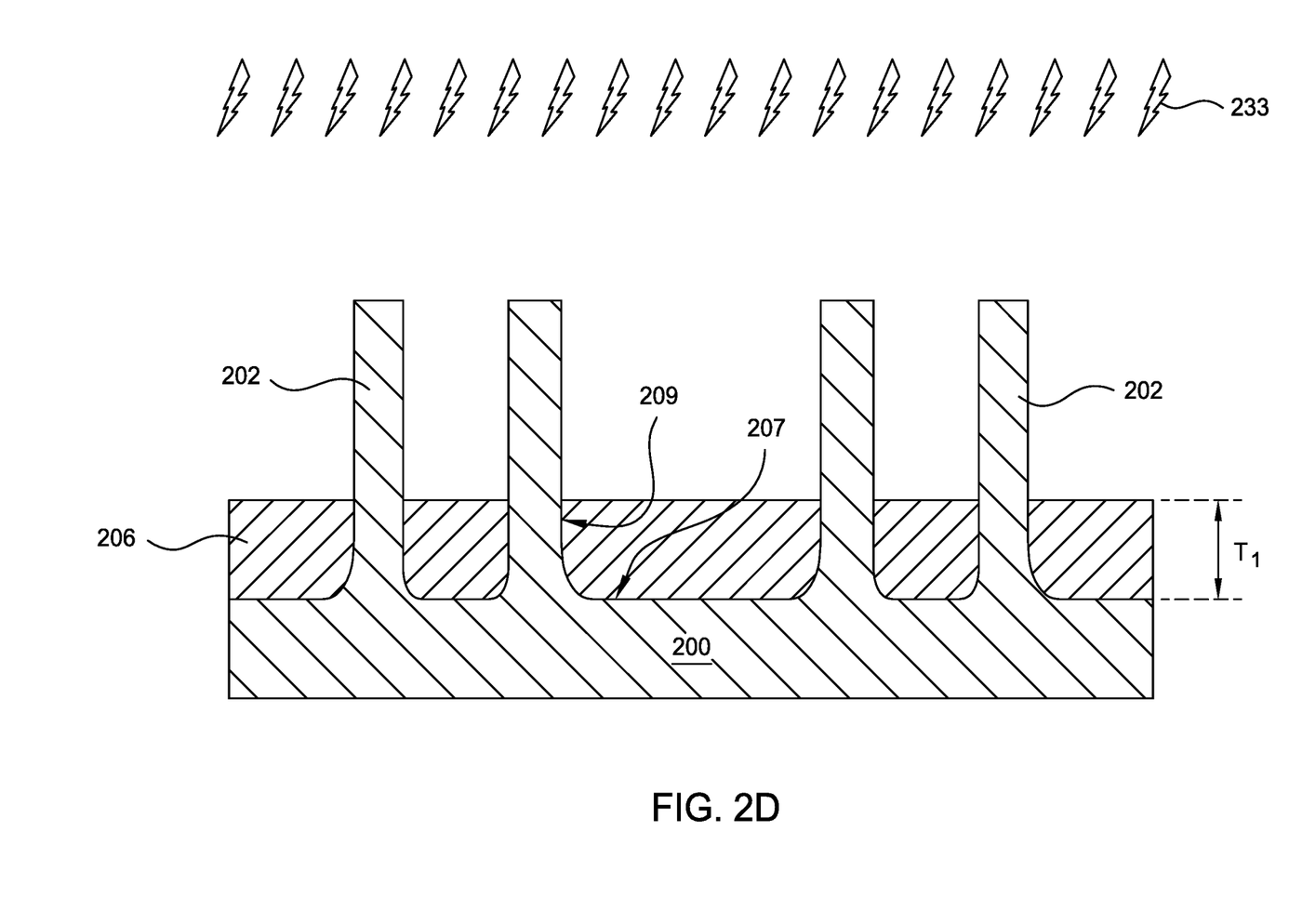

At block 108, after the deposition process (or after the optional curing process if performed) is completed, the substrate 200 is subjected to a second curing process 233 in a plasma chamber to further cure the dielectric layer formed on the substrate 200, as shown in FIG. 2D. In one embodiment, the second curing process 233 is a plasma treatment. The plasma chamber may be any suitable chamber using plasma or plasma-assisted technology. The plasma chamber generates high-density plasma at elevated temperatures to bombard and thus densify and further cure the cured layer (from block 106) or the flowable dielectric layer (from block 104 if the curing process is not performed) with ions from the high-densify plasma.

Depending on the material, the plasma treatment may be performed in an oxygen-containing ambient (if the cured layer or the flowable dielectric layer is an oxide) or a nitrogen-containing ambient (if the cured layer or the flowable dielectric layer is a nitride). The oxygen-containing ambient may be created by introducing one or more oxygen-containing gases such as molecular oxygen ($O_2$), ozone ($O_3$), water vapor ($H_2O$), nitric oxide (NO), nitrogen dioxide ($NO_2$), nitrous oxide ($N_2O$), and any combination thereof, into the plasma chamber. The nitrogen-containing ambient may be created by introducing one or more nitrogen-containing gases such as nitrogen ($N_2$), ammonia ($NH_3$), and any combination thereof, into the plasma chamber. In either case, an inert gas such as argon, hydrogen, or helium may be introduced into the plasma chamber. For example, if the cured layer or the flowable dielectric layer is an oxide, the plasma treatment may be performed in oxygen/helium ambient, oxygen/argon ambient, or oxygen/hydrogen ambient. If the cured layer or the flowable dielectric layer is a nitride, the plasma treatment may be performed in nitrogen/ammonia ambient, nitrogen/hydrogen ambient, or nitrogen/helium ambient.

In some implementations, the plasma treatment may be a radical-based treatment. For example, the oxygen-containing ambient may be or additionally include radical oxygen species and/or radical hydroxyl species that may be generated remotely and transported into the plasma chamber. Likewise, the nitrogen-containing ambient may be or additionally include radical nitrogen species that may be generated remotely and transported into the plasma chamber. The plasma treatment using radicals may be performed at higher pressures (e.g., 1 Torr or above, for example about 10-40 Torr) and/or with pulsed RF power waveforms. For example, the plasma treatment may be an inductively coupled plasma using a pulsed source power operated in a standard mode (i.e., using the same RF frequency and the current flowed through the coil antennas are in-phase).

During plasma treatment, the cured layer or the flowable dielectric layer is further converted into oxides or nitrides due to the oxygen or nitrogen ambient present in the plasma chamber. The oxygen ambient encourages replacement of Si—N bonds or N—H bonds in the cured layer or the flowable dielectric layer with Si—O bonds since Si—N bond energies (355 kJ/mol) and N—H bond energies (386 kJ/mol) are lower than Si—O bond energies (452 kJ/mol). Therefore, when the plasma treatment is performed in an oxygen-containing ambient, the cured layer or the flowable dielectric layer (which has Si—NH—Si backbone) is further converted into a silicon oxide layer. The cured layer or the flowable dielectric layer (which has Si—NH—Si backbone) is further converted into a silicon nitride layer when the plasma treatment is performed in a nitrogen-containing ambient. Therefore, the plasma treatment combines material conversion and densification in one operation without the need of a long duration thermal anneal process, which is typically performed after the curing process in the conventional formation of FCVD films to further incorporate oxygen or nitrogen atoms into the layer. High-density plasma can also enable lower thermal budget as compared to thermal anneal. As a result, the overall thermal budget of a fabrication process is reduced.

In some implementations, the plasma treatment is a two-operation treatment that includes a first plasma treatment operation using oxygen/helium ambient, oxygen/argon ambient, or oxygen/hydrogen ambient (if the cured layer or the flowable dielectric layer is an oxide) and a second plasma treatment operation using an inert gas ambient such as helium. If the cured layer or the flowable dielectric layer is a nitride, the plasma treatment may include a first plasma treatment operation using nitrogen/ammonia ambient, nitrogen/hydrogen ambient, or nitrogen/helium ambient and a second plasma treatment operation using an inert ambient such as helium. The plasma treatment in an inert ambient (e.g., helium) is effective in film densification, as the bombardment by high energy ions allows the film to break existing bonds and re-structure to release film stress and to form a denser network.

The plasma chamber may be any suitable plasma reactor that has separate controls for power input to a plasma source generator and to a substrate bias device. In one implementation, the plasma chamber is an inductively coupled plasma (ICP) chamber. In such a case, the plasma chamber may have a plasma source controller controlling the supply of inductively coupled RF power which determines plasma density (source power), and a bias controller controlling the supply of RF power or DC power which is used to generate a bias voltage on the substrate surface (bias power). This bias voltage is used to attract ions from the plasma formed in the processing region to the substrate 200. The bias voltage can be used to control the bombardment energy of the ion species on the cured layer (or the flowable dielectric layer if the curing process is not performed). Source power and pressure are knobs to control ionization. Bias power provides additional knob to modulate ion energy for film treatment depth control. In addition to bias power, low pressure (e.g., less than about 5 mTorr) enables long mean-free path and deep trench layer treatment. One suitable plasma chamber is a Centura® Advantedge™ Mesa™ Etch chamber available from Applied Materials of Santa Clara, Calif.

While the ICP chamber is used in this disclosure as an example for forming the plasma, it is contemplated that other plasma source, such as a capacitively coupled plasma (CCP) source, a decoupled plasma source (DPS), a magnetron plasma source, an electron cyclotron resonance (ECR) source, or a microwave plasma source, may also be used.

In cases where an ICP chamber is used, the following chamber process parameters may be used to perform the plasma treatment. These parameters can be used to treat the cured layer (from block 106) or the flowable dielectric layer (from block 104) as discussed above. In various implementations, the cured layer is an oxide or nitride. The chamber pressure may be about 1 milli-Torr (mTorr) to about 10 Torr, such as about 2 mTorr to about 1 Torr, for example about 5 mTorr to about 88 mTorr. The source power may be about 50 watts (W) to about 650 W, such as about 100 W to about 500 W, for example about 250 W to about 450 W. The source power may be applied at a radio frequency (RF) range of about 30 MHz to about 60 MHz. The bias power provided to a substrate support of the ICP chamber may be about 10 W to about 450 W, such as about 50 W to about 300 W, for example 100 W to about 200 W. The bias power may be applied at a RF range of about 10 MHz to about 30 MHz. The substrate temperature may be about 550 degrees Celsius or less, such as about 300 degrees Celsius to about 500 degrees Celsius, for example about 350 degrees Celsius. The gas flow of a first gas (e.g., oxygen-containing gas or nitrogen-containing gas) may be about 60 sccm to about 5000 sccm, such as about 100 sccm to about 2200 sccm, for example about 300 sccm to about 1000 sccm. The gas flow of a second gas (e.g., inert gas) may be about 5 sccm to about 250 sccm, such as about 10 sccm to about 150 sccm, for example about 20 sccm to about 100 sccm. The treatment time may be about 10 seconds to about 120 seconds, such as about 30 seconds to about 90 seconds, for example about 45 seconds to about 60 seconds. The process parameters discussed herein are based on a 300 mm substrate. It is contemplated that these process parameters may vary depending upon the thickness of the cured layer (from block 106) or the flowable dielectric layer (from block 104), the size of the trenches 204, the size of the substrate 200, the capability of the plasma chamber, and the application, etc.

Figure 2E:
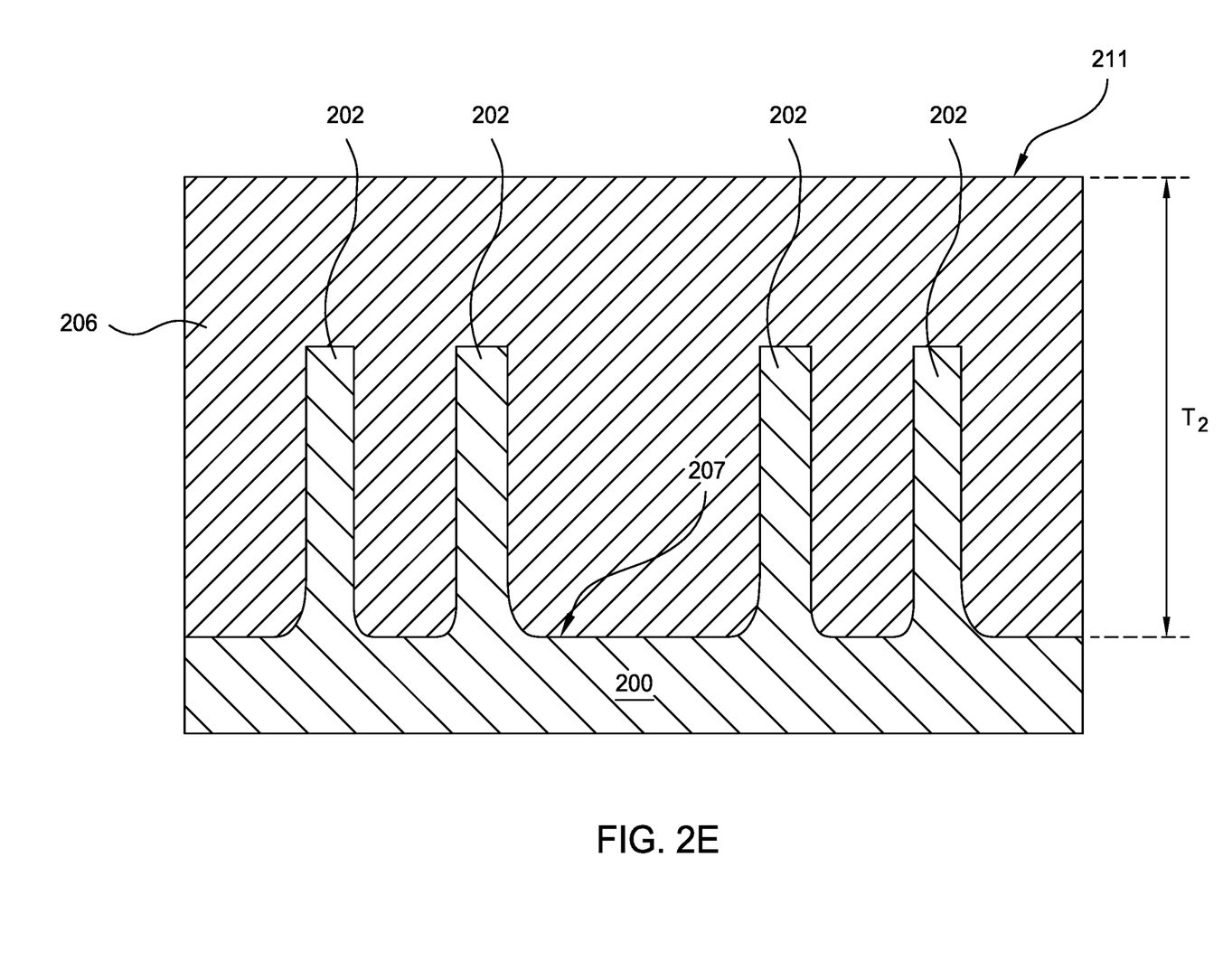
Figure 2F:
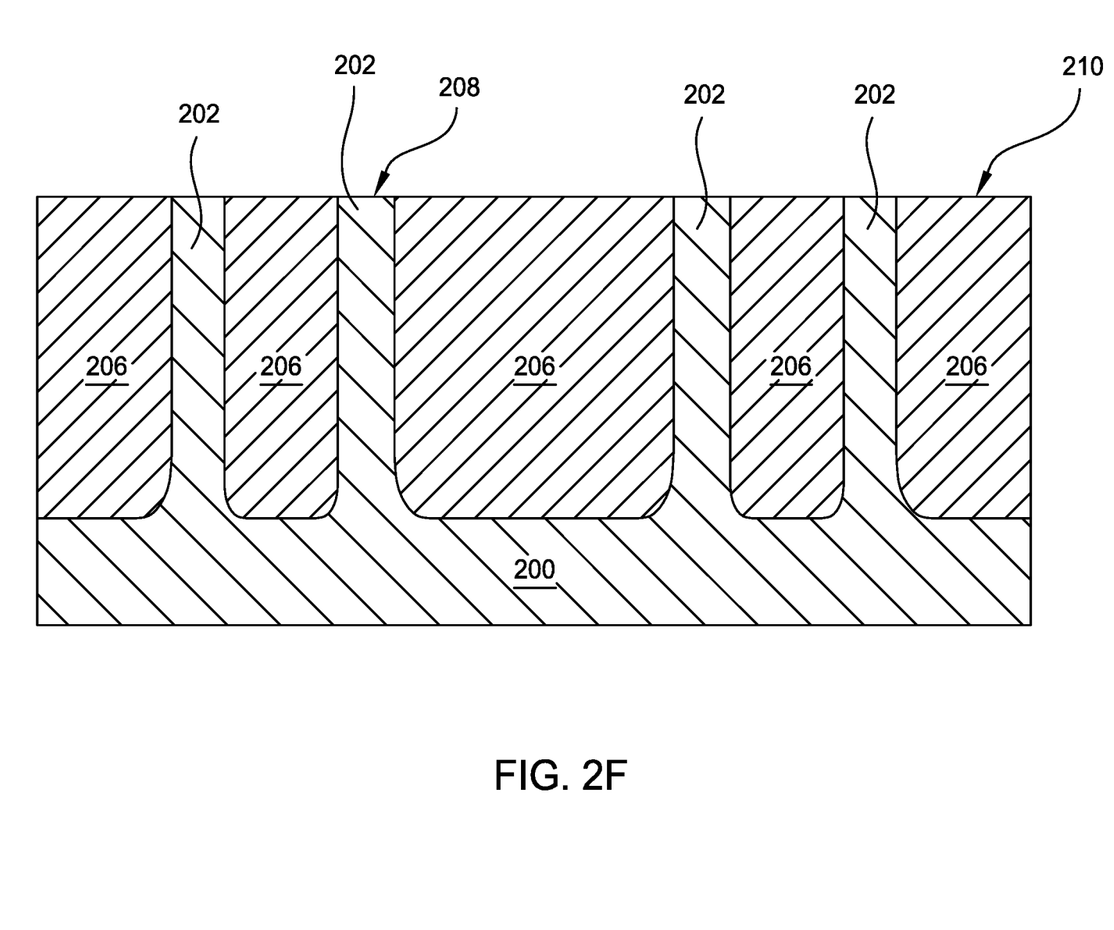
Figure 2G:
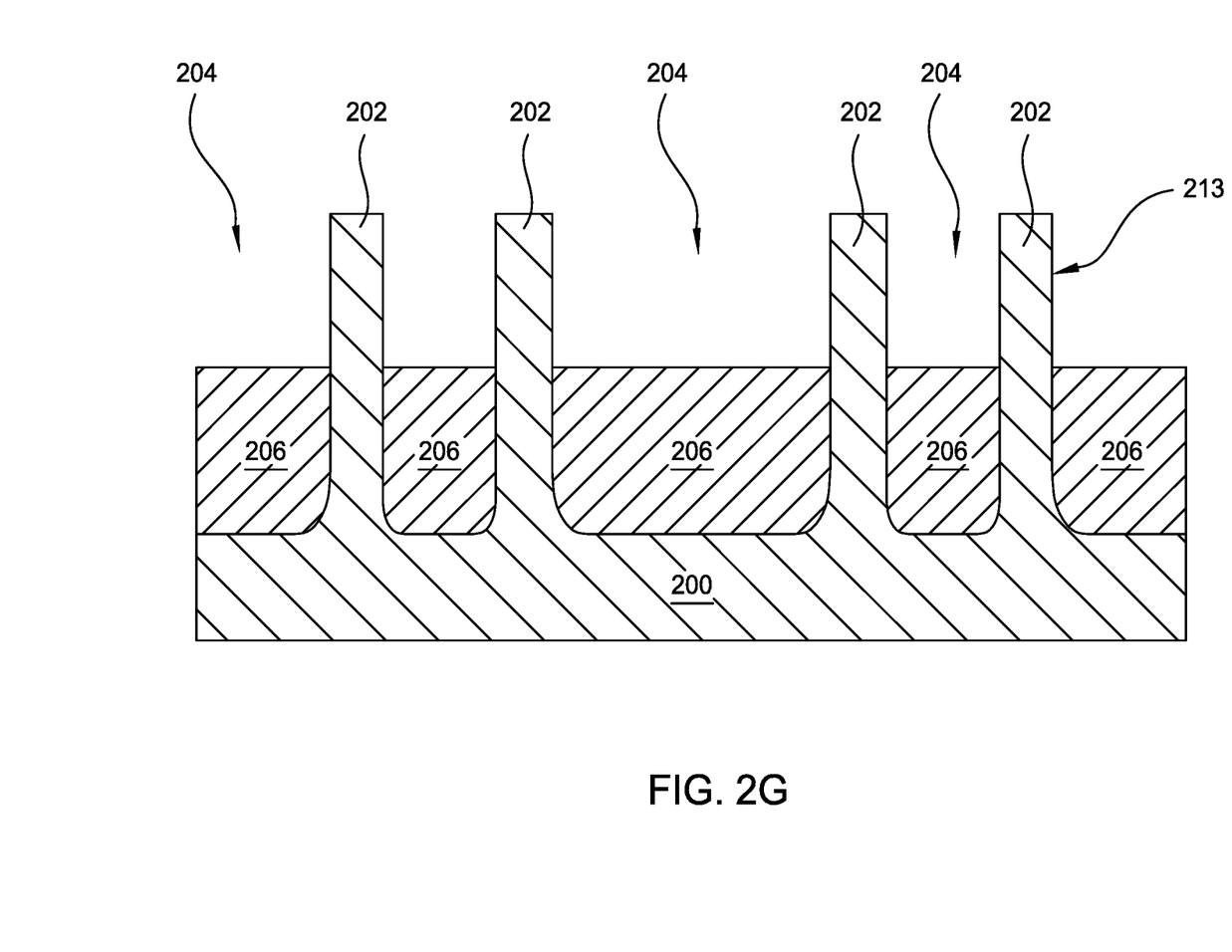

After block 108, a decision 110 is made as to whether the deposited dielectric layer (i.e., a flowable layer 206 that has been cured and/or treated) reaches a target height "T2", as shown in FIG. 2E. The target height "T2" of the deposited dielectric layer may be about 500 Angstroms to about 8000 Angstroms, for example about 1000 Angstroms to about 6000 Angstroms, measuring from the bottom surface 207 the trench 204 to a top surface 211 of the deposited dielectric layer. If the target height "T2" has not been reached, another cycle of deposition/curing/plasma treatment (e.g., blocks 104-108) may be performed before the thickness of the cured/plasma treated layer is again compared to the target thickness. Processes of blocks 104, 106, and 108 may be repeated until the deposited dielectric layer reaches the target height "T2".

Once the target height "T2" is reached, the deposited dielectric layer may be planarized, such as by a chemical mechanical planarization (CMP), so that the top surface 208 of the fins 202 and the top surface 210 of the deposited dielectric layer are co-planar, as shown in FIG. 2C. The substrate 200 is then recessed, such as by using an acceptable etch process, to reveal or expose an upper portion 213 of the fins 202. The etch process may be performed in the same plasma chamber where the plasma treatment (block 108) is taken place. Thereafter, the substrate 200 may be transferred from the plasma chamber to a load-lock chamber and then to one or more front opening unified pod (FOUPs) where the substrates are to be transferred to other processing systems for downstream processing such as replacement gate formation, epitaxial deposition, cleaning, annealing, thermal, chemical vapor deposition, oxidation or nitridation process, etc., that may be required to fabricate an integrated circuit chip.

Figure 3:
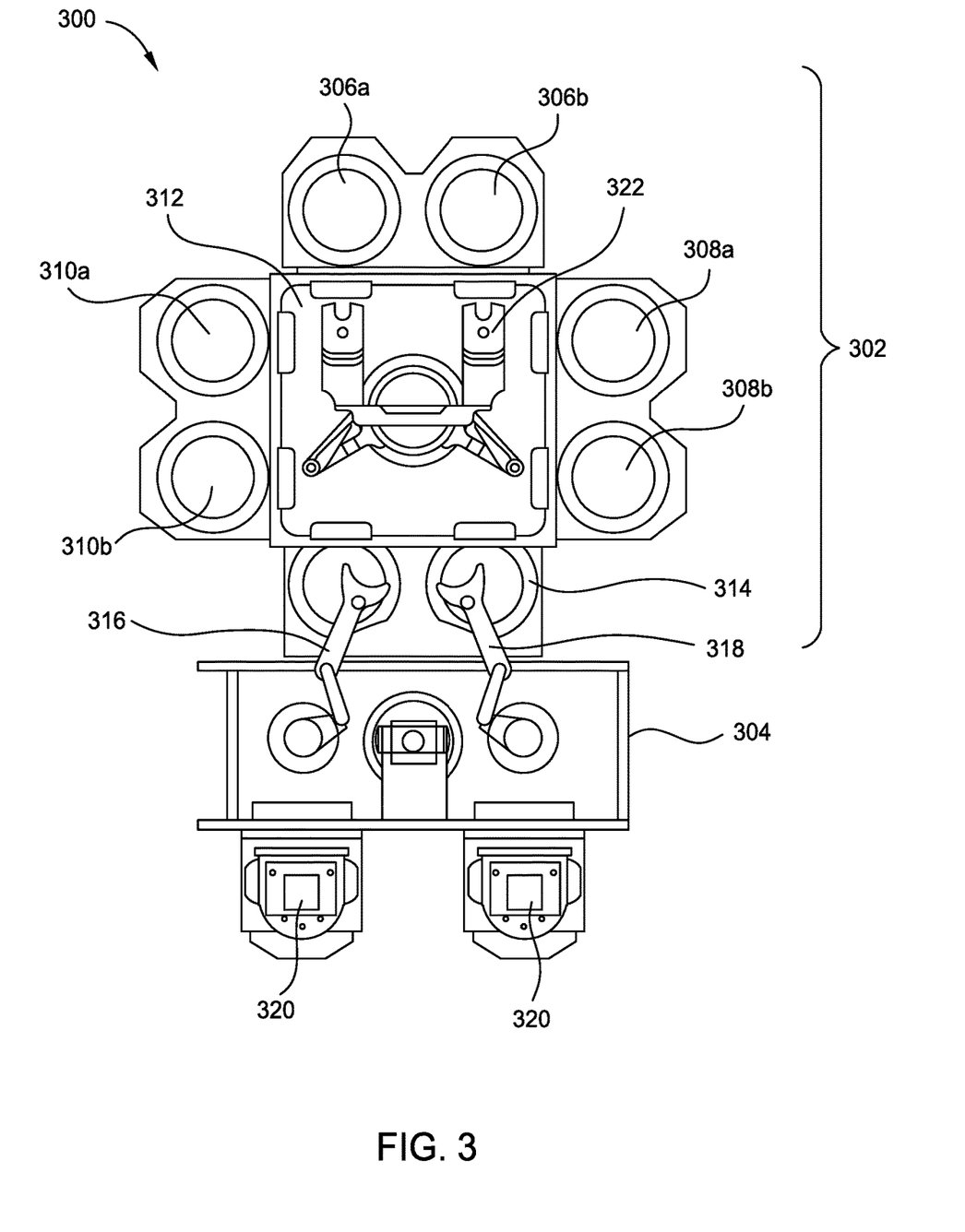
FIG. 3 is a schematic top view of a processing system that can be used to perform the processing sequence illustrated in FIG. 1 in accordance with implementations of the present disclosure.

FIG. 3 is a schematic top view of a processing system 300 that can be used to perform the processing sequence illustrated in FIG. 1 in accordance with implementations of the present disclosure. One example of the processing system 300 is the PRODUCER® or CENTRIS™ system available from Applied Materials, Inc., of Santa Clara, Calif. The processing system 300 includes a vacuum-tight processing platform 302 and a factory interface 304. The platform 302 includes a plurality of processing chambers 306a-b, 308a-b, 310a-b coupled to a vacuum substrate transfer chamber 312, and a load lock chamber 314 that is disposed between and coupled to the vacuum substrate transfer chamber 312 and the factory interface 304.

The factory interface 304 includes at least one factory interface robot 316, 318 to facilitate transfer of substrates. The factory interface 304 is configured to accept one or more front opening unified pod (FOUP) 320. In one example, three FOUPs are configured to engage the factory interface 304. The factory interface robots 316, 318 transfer the substrates (e.g., substrates described in block 102) from the factory interface 304 to the processing platform 302 where at least one transfer robot 322 receives the substrates from the factory interface robots 316, 318 and then transfers them to any of the processing chambers 306a-b, 308a-b, 310a-b. In one implementation, the processing chambers 306a-b are deposition chambers that may be used to perform processes described in block 104. The processing chambers 308a-b are curing chamber that may be used to perform processes described in block 106. The processing chambers 310a-b are plasma chambers that may be used to perform processes described in block 108 and the fin reveal process. Once the processes are completed, the substrates are transferred by the transfer robot 322 to the load lock chamber 314. The factory interface robot 316, 318 then pick up the substrates from the load lock chamber 314 and transports them back to the FOUPs 320.

Figure 4:
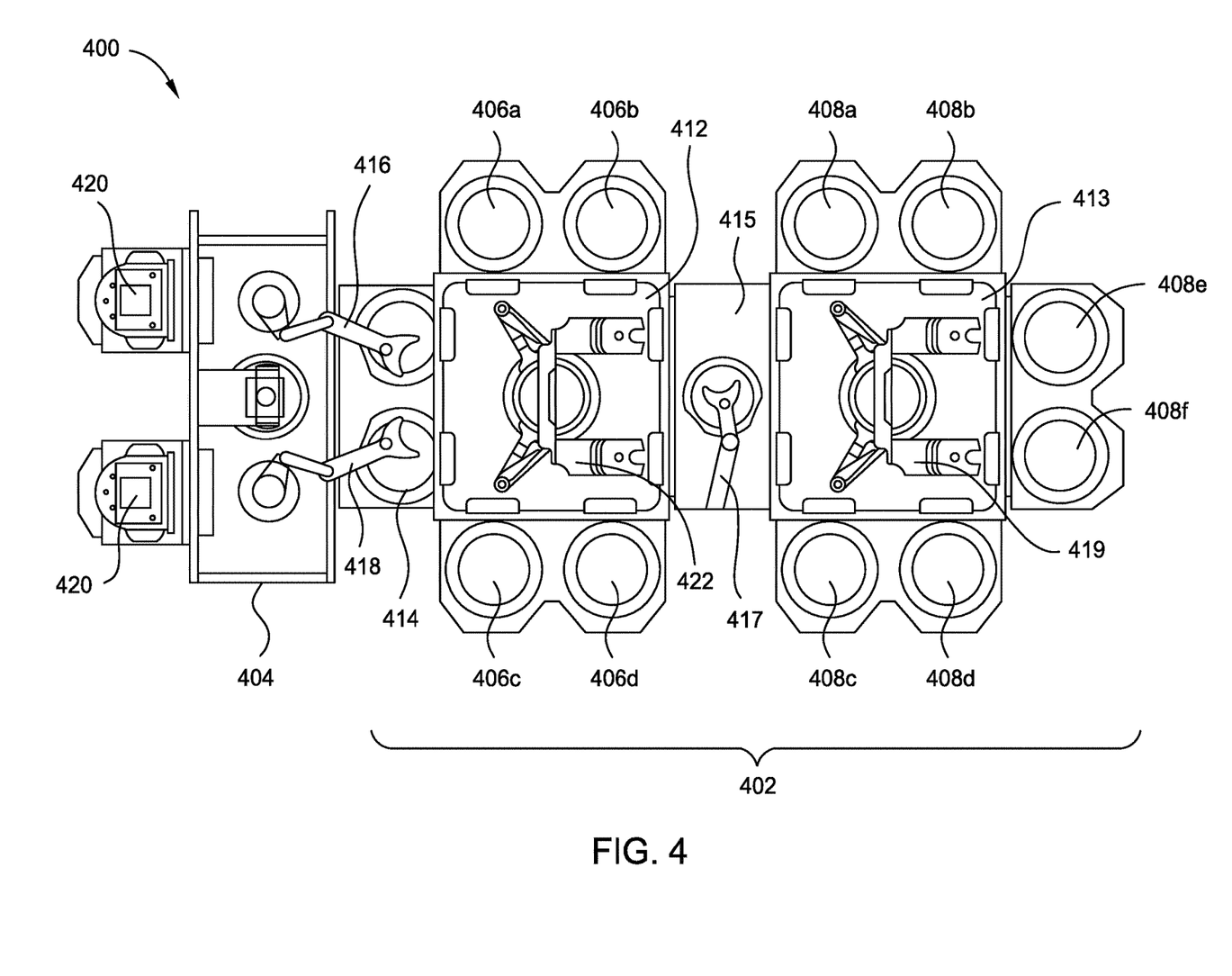
FIG. 4 is a schematic top view of a processing system that can be used to perform processes of the processing sequence illustrated in FIG. 1 in accordance with implementations of the present disclosure.

FIG. 4 is a schematic top view of a processing system 400 that can be used to perform processes of the processing sequence illustrated in FIG. 1 in accordance with implementations of the present disclosure. In one exemplary implementation, the processing system 400 is a high-volume manufacturing (HVM) system that is used to perform certain processes (e.g., blocks 102, 104 and 108) shown in FIG. 1. The processing system 400 includes a vacuum-tight processing platform 402 and a factory interface 404. The platform 402 includes a plurality of processing chambers 406a-d, 408a-f coupled to a first vacuum substrate transfer chamber 412 and a second vacuum substrate transfer chamber 413, respectively, a cooling station 415 disposed between the first vacuum substrate transfer chamber 412 and the second vacuum substrate transfer chamber 413, and a load lock chamber 414 that is disposed between and coupled to the first vacuum substrate transfer chamber 412 and the factory interface 404.

The factory interface 404 includes at least one factory interface robot 416, 418 to facilitate transfer of substrates. The factory interface 404 is configured to accept one or more front opening unified pod (FOUP) 420. In one example, four FOUPs are adapted. The factory interface robots 416, 418 transfer the substrates (e.g., substrates described in block 102) from the factory interface 404 to the processing platform 402. At least one transfer robot 422 at the first vacuum substrate transfer chamber 412 receives the substrates from the factory interface robots 416, 418 and then transfers the substrates to any of the processing chambers 406a-d. In one implementation, the processing chambers 406a-d are plasma chamber that may be used to perform processes described in block 108. An optional transfer robot 417 may be disposed at the cooling station 415 to transfer the substrates between the first vacuum substrate transfer chamber 412 and the second vacuum substrate transfer chamber 413. At least one transfer robot 419 at the second vacuum substrate transfer chamber 413 receives the substrates from the cooling station 415 and then transfers them to any of the processing chambers 408a-f. Alternatively, the transfer robot 417 may be omitted and the transfer robot 417, 422 can work together to transfer the substrates between the first vacuum substrate transfer chamber 412 and the second vacuum substrate transfer chamber 413. In one implementation, the processing chambers 408a-f are deposition chamber that may be used to perform processes described in block 104. The substrates may be transferred between the deposition chambers (i.e., processing chambers 408a-f) and the plasma chambers (i.e., processing chambers 406a-d) until the target height of the deposited dielectric layer has been reached. Once the processes are completed, the substrates are transferred to the load lock chamber 414. The factory interface robot 416, 418 then pick up the substrates from the load lock chamber 414 and transports the substrates back to the FOUPs 420.

To summarize, the implementations disclosed herein relate to methods for forming and filling trenches in a substrate with a flowable dielectric layer. The method includes bombarding the flowable dielectric layer with ions from a high-density, inductively coupled plasma in an oxygen-containing/inert gas or nitrogen-containing/inert gas ambient to convert and densify the dielectric layer to target layer composition. A curing process may be inserted between the flowable deposition and the plasma treatment to help film crosslinking and incorporation of oxygen/nitrogen atoms into the flowable dielectric layer. These processes are performed in a cyclic fashion until a desired thickness is reached. Cyclic process enables consistently good quality of dielectric layer at trench bottom with minimal deposition on the sidewall of the trenches.

While the foregoing is directed to implementations of the present disclosure, other and further implementations of the disclosure may be devised without departing from the basic scope thereof, and the scope thereof is determined by the claims that follow.

What is claimed is:

1. A method of processing a substrate, comprising:
    subjecting a substrate having at least one trench to a deposition process to form a flowable layer over a bottom surface and sidewall surfaces of the trench in a bottom-up fashion until the flowable layer reaches a predetermined deposition thickness;
    subjecting the flowable layer to a first curing process, the first curing process being a UV curing process; then
    subjecting the UV cured flowable layer to a second curing process, the second curing process being a plasma or plasma-assisted process; and
    performing sequentially and repeatedly the deposition process, the first curing process, and the second curing process until the plasma cured flowable layer fills the trench and reaches a predetermined height over a top surface of the trench.

2. The method of claim 1, wherein the flowable layer is a silicon-containing dielectric layer.

3. The method of claim 1, wherein the first curing process is performed in a radical-based ambient comprising oxygen, nitrogen, or an inert gas.

4. The method of claim 1, wherein the second curing process is performed in oxygen/helium ambient, oxygen/argon ambient, or oxygen/hydrogen ambient.

5. The method of claim 4, wherein the second curing process is performed in a radical-based ambient.

6. The method of claim 1, wherein the flowable layer is deposited at a deposition rate of about 5 Angstroms/second or less.

7. The method of claim 1, wherein the predetermined deposition thickness is in a range of about 20 Angstroms to about 300 Angstroms, and the predetermined height is in a range of about 500 Angstroms to about 8,000 Angstroms.

8. The method of claim 1, wherein the flowable layer comprises SiC, SiO, SiCN, $SiO_2$, SiOC, SiOCN, SiON, or SiN.

9. A method of processing a substrate, comprising:
    performing a deposition process by reacting a silicon-containing precursor with an oxygen-based radical precursor and a nitrogen-based radical precursor to form a flowable layer within a trench of a substrate;
    curing the flowable layer with UV energy in an oxygen-containing ambient, a nitrogen-containing ambient, or an inert gas ambient during a first curing process; then
    curing the UV cured flowable layer in a plasma chamber during a second curing process, wherein the plasma chamber contains an oxygen-containing ambient or a nitrogen-containing ambient; and
    performing sequentially and repeatedly the deposition process, the first curing process, and the second curing process until the plasma cured flowable layer fills the trench and reaches a predetermined height over a top surface of the trench.

10. The method of claim 9, wherein the silicon-containing precursor comprises siloxane compounds or halogenated siloxane compounds that containing one or more halogen moieties.

11. The method of claim 9, wherein curing the UV cured flowable layer further comprises:
    bombarding the UV cured flowable layer with ions in an oxygen/helium ambient, an oxygen/argon ambient, or an oxygen/hydrogen ambient; and
    bombarding the UV cured flowable layer with ions in an inert gas ambient.

12. The method of claim 11, wherein the plasma chamber is an inductively coupled plasma (ICP) chamber.

13. The method of claim 11, wherein curing the UV cured flowable layer further comprises:
    applying a bias power to the substrate at a chamber pressure of about 5 mTorr or less.

14. The method of claim 9, wherein curing the flowable layer with the UV energy is performed in a radical-based ambient.

15. A method of processing a substrate, comprising:
    forming a flowable layer over a bottom surface and sidewall surfaces of a trench on a substrate in a bottom-up fashion during a deposition process;
    exposing the flowable layer to UV energy to produce a UV cured flowable layer during a first curing process; then
    exposing the UV cured flowable layer to a plasma to produce a plasma cured flowable layer during a second curing process; and
    performing sequentially and repeatedly the deposition process, the first curing process, and the second curing process until the plasma cured flowable layer fills the trench and reaches a predetermined height over a top surface of the trench.

16. The method of claim 15, wherein the flowable layer is a silicon-containing dielectric layer.

17. The method of claim 15, wherein the flowable layer comprises SiC, SiO, SiCN, $SiO_2$, SiOC, SiOCN, SiON, or SiN.

18. The method of claim 15, wherein the flowable layer is deposited at a deposition rate of about 5 Angstroms/second or less.

19. The method of claim 15, wherein the deposition process comprises reacting a silicon-containing precursor to form the flowable layer, and wherein the silicon-containing precursor comprises siloxane compounds or halogenated siloxane compounds containing one or more halogen moieties.

20. The method of claim 15, wherein the predetermined height is in a range of about 500 Angstroms to about 8,000 Angstroms.

* * * * *

UNITED STATES PATENT AND TRADEMARK OFFICE
CERTIFICATE OF CORRECTION

PATENT NO. : 10,707,116 B2
APPLICATION NO. : 15/977380
DATED : July 7, 2020
INVENTOR(S) : Jingmei Liang et al.

Page 1 of 1

It is certified that error appears in the above-identified patent and that said Letters Patent is hereby corrected as shown below:

On the Title Page

Item (74), in Column 2, in "Attorney, Agent, or Firm", Line 1, delete "+Sheridan," and insert -- + Sheridan, --, therefor.

In the Specification

In Column 4, Line 50, delete "($Si_3H_6$)," and insert -- ($Si_3H_8$), --, therefor.

In the Claims

In Column 12, Line 27, in Claim 10, after "compounds" delete "that".

Signed and Sealed this
First Day of September, 2020

Andrei Iancu
*Director of the United States Patent and Trademark Office*